United States Patent
Chang et al.

(10) Patent No.: US 8,253,941 B2
(45) Date of Patent: Aug. 28, 2012

(54) APPARATUS FOR MANUFACTURING DISPLAY PANEL AND METHOD FOR MANUFACTURING THE SAME

(75) Inventors: Jae-Hyuk Chang, Seongnam-si (KR); Nam-Seok Roh, Seongnam-si (KR); Jung-Mok Bae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1283 days.

(21) Appl. No.: 11/513,918

(22) Filed: Aug. 31, 2006

(65) Prior Publication Data

US 2007/0262936 A1    Nov. 15, 2007

(30) Foreign Application Priority Data

May 9, 2006  (KR) .................. 10-2006-0041435

(51) Int. Cl.
*G01B 11/00* (2006.01)
*G09G 3/10* (2006.01)
*G02F 1/13* (2006.01)
*H01J 9/00* (2006.01)

(52) U.S. Cl. .................. 356/401; 315/169.3; 315/169.4; 349/187; 445/24

(58) Field of Classification Search .......... None
See application file for complete search history.

(56) References Cited

U.S. PATENT DOCUMENTS

| | | | |
|---|---|---|---|
| 5,772,905 A | 6/1998 | Chou | 216/44 |
| 6,309,580 B1 | 10/2001 | Chou | 264/338 |
| 6,799,826 B2 * | 10/2004 | Moon et al. | 347/19 |
| 6,972,844 B2 | 12/2005 | Tokita | 356/401 |
| 6,986,975 B2 | 1/2006 | Sreenivasan et al. | 430/22 |
| 7,745,237 B2 * | 6/2010 | Katagiri et al. | 438/14 |
| 7,835,001 B2 * | 11/2010 | Kwack et al. | 356/399 |
| 2004/0131718 A1 * | 7/2004 | Chou et al. | 425/385 |
| 2005/0079331 A1 | 4/2005 | Ikeda et al. | |
| 2005/0275125 A1 | 12/2005 | Kawakami et al. | 264/40.5 |
| 2006/0055864 A1 * | 3/2006 | Matsumura et al. | 349/187 |
| 2006/0157444 A1 | 7/2006 | Nakamura et al. | 216/54 |
| 2008/0163769 A1 * | 7/2008 | Sewell | 101/28 |
| 2009/0214689 A1 * | 8/2009 | Bailey et al. | 425/150 |
| 2010/0148397 A1 * | 6/2010 | Nakamura et al. | 264/293 |

(Continued)

FOREIGN PATENT DOCUMENTS

CN    1591047 A    3/2005

(Continued)

OTHER PUBLICATIONS

Brittain et al.; "Soft lithography and microfabrication"; Physics World, May 1998, pp. 31-36.

*Primary Examiner* — Tarifur Chowdhury
*Assistant Examiner* — Gordon Stock, Jr.
(74) *Attorney, Agent, or Firm* — Cantor Colburn LLP

(57) ABSTRACT

An apparatus for manufacturing a display panel includes an arriving part in which an unfinished display panel is disposed. The apparatus has at least one light transmitting part, a mold which is positioned on the arriving part and which includes at least one alignment key and a pattern forming part, a mold driver which drives the mold, and an alignment sensor which is positioned under the arriving part and which determines whether the display panel and the mold are erroneously aligned through the light transmitting part. Therefore, it is possible to efficiently and accurately pattern a specific material onto the display panel through an imprint lithography process using a pressing mold.

7 Claims, 17 Drawing Sheets

U.S. PATENT DOCUMENTS

2010/0201042 A1* 8/2010 Sreenivasan et al. ......... 264/494
2011/0272840 A1* 11/2011 Suehira et al. ............... 264/40.5

FOREIGN PATENT DOCUMENTS

| | | |
|---|---|---|
| JP | 61166518 A * | 7/1986 |
| JP | 07-092696 | 4/1995 |
| JP | 2000-323461 | 11/2000 |
| JP | 2003-086537 | 3/2003 |
| JP | 2004259985 | 9/2004 |
| JP | 2005031662 | 2/2005 |
| JP | 2005077844 | 3/2005 |
| JP | 2005-100584 | 4/2005 |
| JP | 2005-101201 | 4/2005 |
| JP | 2005-108975 | 4/2005 |
| JP | 2005-116978 | 4/2005 |
| JP | 2005-205915 | 8/2005 |
| JP | 2005-274922 | 10/2005 |
| JP | 2005533393 | 11/2005 |
| JP | 2005-537656 | 12/2005 |
| JP | 2006-005023 | 1/2006 |
| JP | 2006019707 | 1/2006 |
| JP | 2007323059 | 12/2007 |
| KR | 10-2003-0079909 | 10/2003 |
| KR | 10-2004-0004401 | 1/2004 |
| KR | 10-2004-0021592 | 3/2004 |
| WO | 2004016406 A1 | 2/2004 |
| WO | 2004044966 A1 | 5/2004 |
| WO | WO 2004047057 A1 * | 6/2004 |

* cited by examiner

APPARATUS FOR MANUFACTURING DISPLAY PANEL AND METHOD FOR MANUFACTURING THE SAME

This application claims priority to Korean Patent Application No. 10-2006-0041435, filed on May 9, 2006, and all the benefits accruing therefrom under 35 U.S.C. §119, the contents of which in its entirety are herein incorporated by reference.

BACKGROUND OF THE INVENTION (a) Field of the Invention

The present invention relates to a manufacturing apparatus and a manufacturing method of a display panel for a display device.

(b) Description of the Related Art

A liquid crystal display ("LCD") is currently the most widely used of the various types of flat panel displays. A typical LCD includes two panels which are provided with field generating electrodes such as pixel electrodes and a common electrode, and a liquid crystal layer which is interposed therebetween. The LCD generates an electric field in the liquid crystal layer by applying a voltage to the field generating electrodes, thereby determining an orientation of the liquid crystal molecules of the liquid crystal layer and thereby controlling polarization of light incident to the liquid crystal layer. This polarization may be used to either block light from passing through the liquid crystal layer or allow that light to pass through. A plurality of pixels, each controlling an electric field generated in a liquid crystal layer to either block or pass light may be arranged so as to display an image.

In order to manufacture such a liquid crystal display, patterning of a plurality of thin films is required. A photolithography process is generally employed for this purpose.

However, because the photolithography process includes very complicated steps such as deposition, exposure, development, etching and ashing of a thin film, it requires a long process time and expensive equipment. Accordingly, it causes an increase in manufacturing time and cost when used in the production of a liquid crystal display.

BRIEF SUMMARY OF THE INVENTION

It is an aspect of the present invention to provide an apparatus for manufacturing a display panel and a method of using the same to manufacture a display which has the advantages of being patterned efficiently and accurately using a thin film without a photolithography process.

An exemplary embodiment of an apparatus for manufacturing a display panel according to the present invention, includes; an arriving part in which a display panel is disposed, and which has at least one light transmitting part, a mold which is positioned on the arriving part and which includes at least one alignment key and a pattern forming part, a mold driver which drives the mold, and an alignment sensor which is positioned under the arriving part and which determines whether the display panel and the mold are erroneously aligned, through the light transmitting part.

According to an exemplary embodiment of the present invention, the arriving part may include a fixing chuck for fixing the disposed display panel and a support for supporting the fixing chuck, and the light transmitting part may be formed in the fixing chuck.

According to an exemplary embodiment of the present invention, the alignment key may include a protrusion and a recess which is surrounded by the protrusion.

According to an exemplary embodiment of the present invention, the apparatus may further include a non-transparent film which is formed on a surface of the alignment key.

According to an exemplary embodiment of the present invention, the non-transparent film may include at least one of a metal layer, a metal oxide film, and an inorganic film.

Another exemplary embodiment of the present invention provides a mold portion of an apparatus for manufacturing a display device, wherein the mold portion is to be brought into contact with an arriving portion, the mold portion comprising; a main body, at least one pattern forming part protruding from the main body corresponding to a predetermined to be formed on a display panel, at least one alignment key formed on the main body to determine whether the display panel and the main body are aligned; and a non-transparent film formed on a surface of the alignment key.

According to an exemplary embodiment of the present invention, the alignment key has a protrusion and a recess which is surrounded with the protrusion.

According to an exemplary embodiment of the present invention, the non-transparent film comprises at least one of a metal layer, a metal oxide film, and an inorganic film.

Another exemplary embodiment of the present invention provides a method of manufacturing a display panel, including; providing a display panel including a display area and a non-display area which is formed around the display area and which includes at least one first alignment key formed in the non-display area, disposing the display panel in an arriving part having a light transmitting part, coating an organic film on the display panel, pressurizing the organic film using a mold including at least one second alignment key and a pattern forming part, determining whether the display panel and the mold are erroneously aligned by confirming an aligned state of the first alignment key and the second alignment key through the light transmitting part, hardening the organic film, and removing the mold from the hardened organic film.

According to an exemplary embodiment of the present invention, the method may further include etching the organic film after removing the mold.

According to an exemplary embodiment of the present invention, the determining whether the display panel and the mold are erroneously aligned may include irradiating an alignment sensing light through the light transmitting part, and determining the position relationship of the first alignment key and the second alignment key by sensing the reflection of the alignment sensing light from either of the first and second alignment sensing keys.

According to an exemplary embodiment of the present invention, the method may further include a step between determining whether the display panel and the mold are erroneously aligned and hardening the organic film, that step including aligning the display panel and the mold by relatively moving at least one of the display panel and the mold.

According to an exemplary embodiment of the present invention, at least one of heat hardening and ultraviolet hardening may be used in hardening the organic film.

According to an exemplary embodiment of the present invention, the method may further include additionally hardening the organic film which is positioned in a portion corresponding to the second alignment key when ultraviolet hardening is used in hardening the organic film.

According to an exemplary embodiment of the present invention, the organic film may be a resin film.

Yet another exemplary embodiment of the present invention provides a method of manufacturing a display panel, including; forming a gate line on a substrate, forming a gate insulating layer on the gate line, forming a semiconductor layer and an ohmic contact layer on the gate insulating layer, forming a data line including a source electrode on the gate insulating layer and the ohmic contact layer, forming a drain electrode which is opposite to the source electrode and separated therefrom by a predetermined interval, forming a passivation layer on the data line and the drain electrode, and forming a pixel electrode which is connected to the drain electrode on the passivation layer, wherein at least one of the preceding steps includes coating an organic film on the display panel, pressurizing the organic film using a mold, determining whether the substrate and the mold are erroneously aligned, hardening the organic film, and removing the mold from the hardened organic film.

According to an exemplary embodiment of the present invention, the display panel may include a reflection region and a transmission region, and wherein the forming of the passivation layer may include coating the organic film on the substrate, pressurizing the organic film using a mold which is provided with a protrusion which forms a contact hole in the organic film when applied thereto and a protrusion and depression pattern which embosses a pattern on the organic film when applied thereto, determining whether the substrate and the mold are erroneously aligned, hardening the organic film, and completing a passivation layer having an embossed surface and a contact hole by removing the mold from the hardened organic film.

According to an exemplary embodiment of the present invention, the method may further include exposing a part of the gate line by etching the gate insulating layer which is exposed through a contact hole of the passivation layer.

DETAILED DESCRIPTION OF THE INVENTION

Figure 1:
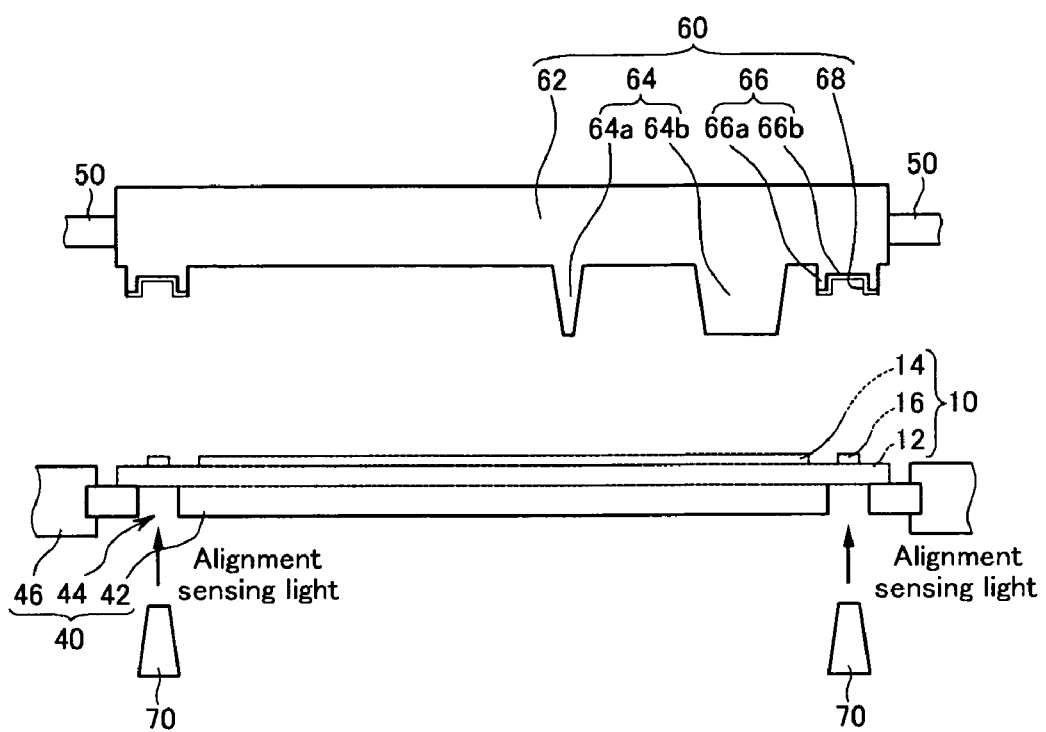
FIG. 1 is a cross-sectional view of an exemplary embodiment of an apparatus for manufacturing a display panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

An apparatus for manufacturing a display panel according to an exemplary embodiment of the present invention will now be described with reference to FIG. 1.

FIG. 1 is a cross-sectional view of an exemplary embodiment of an apparatus for manufacturing a display panel according to the present invention.

The exemplary embodiment of an apparatus for manufacturing a display panel according to the present invention includes an arriving part 40, a mold driver 50, a mold 60, and an alignment sensor 70.

In FIG. 1, the display panel 10, which is the target of the work to be performed by the apparatus, is shown with a dotted line as it is not a part of the apparatus itself. The display panel 10 includes a substrate 12, a thin film 14 to be patterned, and a display panel alignment key 16.

The work target display panel 10 is deposited on the arriving part 40 which includes a fixing chuck 42 for preventing the display panel 10 from moving during the production process and a support 46 for supporting the fixing chuck 42.

The fixing chuck 42 includes at least one of a vacuum chuck and a static electricity chuck to hold the display panel 10 in place. A light transmitting part 44 is formed in the fixing chuck 42. The light transmitting part 44 allows an alignment sensor 70 to determine the state of alignment of the display panel 10 and the mold 60. The light transmitting part is formed to have a wider cross-sectional area than the cross-sectional area of the display panel alignment key 16. The light transmitting part 44 may be a hole penetrating the fixing chuck or a hole which is blocked by transparent glass, etc., so that light may transmit therethrough.

The mold 60, which is driven by the mold driver 50, is arranged so that it may be brought into contact with the arriving part 40. The mold 60 includes a main body 62, a pattern forming part 64 which protrudes from the main body 62 toward the arriving part 40 and which has a predetermined pattern, and a mold alignment key 66. The pattern forming part 64 includes different shapes of protrusions 64a and 64b for forming a specific pattern when brought into contact with the display panel 10. The mold alignment key 66 is formed in a position of the mold 60 corresponding to the display panel alignment key 16. The mold alignment key 66 includes a protrusion 66a and a recess 66b which is surrounded by the protrusion 66a.

A non-transparent film 68 is uniformly provided on the surface of the mold alignment key 66 for reflecting or absorbing an irradiated sensing light. The irradiated sensing light may be provided by the alignment sensor 70 or by another light source (not shown). The non-transparent film 68 includes at least one of a metal film, a metal oxide film, and an inorganic film. The protrusion 66a and the recess 66b of the mold alignment key 66 are visually identified due to the non-transparent film 68 which is formed on the protrusion 66a and the recess 66b. Therefore, an aligned state can be easily confirmed with the display panel alignment key 16 seen on the backdrop of the mold alignment key.

The alignment sensor 70 is provided under the arriving part 40. The alignment sensor 70 can confirm an aligned state of the display panel alignment key 16 and the mold alignment key 66 by detecting irradiated sensing light which is returned through the light transmitting part 44.

Although not shown, an ultraviolet light irradiating part for hardening an organic film, to be described below, may be positioned in the upper part of the mold 60.

In an exemplary embodiment of the present invention, if the alignment sensor 70 is disposed in a lower part of the arriving part 40, there is an advantage that the mold driver 50 and the ultraviolet light irradiating part (not shown), which are positioned in the mold part of the apparatus for manufacturing a display panel are easily substituted with other molds possibly having different patterning parts. Additionally, with the mold driver 50 positioned at an upper part of the display panel 10 and an ultraviolet light irradiating part (not shown) for ultraviolet hardening also positioned above the display panel 10, an imprint lithography process can be easily performed even in a narrow space, thereby improving manufacturing efficiency.

Now, an exemplary embodiment of a method of manufacturing a display panel according to the present invention will be described with reference to FIGS. 2A to 2K.

Figure 2A:
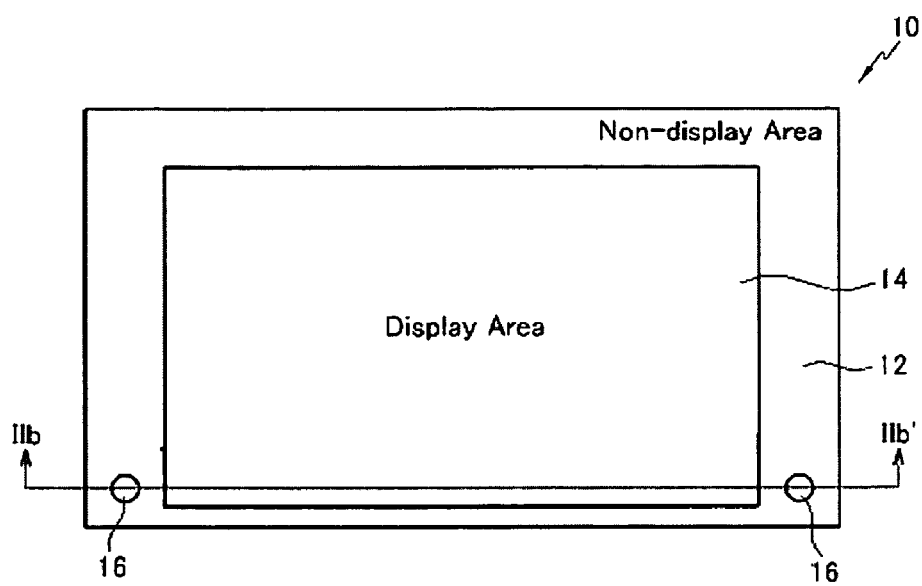
FIG. 2A is a top plan view of a display panel in an intermediate step of an exemplary embodiment of a method of manufacturing the display panel according to the present invention.
Figure 2B:
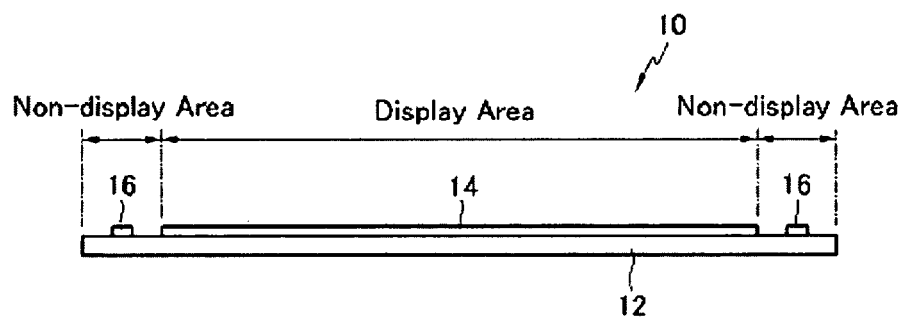
FIG. 2B is a cross-sectional view of the display panel taken along line IIb-IIb' of FIG. 2A.

FIG. 2A is a top plan view of a display panel in an intermediate step of an exemplary embodiment of a method of manufacturing a display panel according to the present invention, FIG. 2B is a cross-sectional view of the display panel taken along line IIb-IIb' of FIG. 2A, and FIG. 2C to FIG. 2F are cross-sectional views of a display panel and an apparatus for manufacturing a display panel in intermediate steps of an exemplary embodiment of a method of manufacturing a display panel according to the present invention. FIGS. 2G and 2H are views illustrating the position relationship of a first alignment key and a second alignment key in 'A' region of FIG. 2F as seen from an alignment sensor below an arriving part, FIGS. 2I and 2J are cross-sectional views of a display panel and an apparatus for manufacturing a display panel in intermediate steps of an exemplary embodiment of a method of manufacturing a display panel according to the present invention, and FIG. 2K is a cross-sectional view of a display panel in an intermediate step of an exemplary embodiment of a method of manufacturing a display panel according to the present invention.

First, as shown in FIGS. 2A and 2B, a display panel 10, which is the target of the manufacturing process, is provided.

The display panel 10 is used in a flat display device such as an organic light emitting diode display ("OLED"), a plasma display device ("PDP"), an electrophoresis display device ("EPD"), or other similar displays, in addition to a liquid crystal display. The display panel 10 is provided with a display area and a non-display area, wherein the non-display area is formed around the display area.

The display panel 10 includes a substrate 12 consisting of transparent glass or other materials with similar characteristics, a thin film 14, and a display panel alignment key 16, wherein the thin film 14 and the panel alignment key 16 are formed on the substrate 12.

The thin film 14 may be a thin film in which a specific pattern is already formed or a thin film which requires formation of a specific pattern. The specific pattern may be a signal line for driving a display device, a recess, a protrusion, or other similar patterns.

Although in this exemplary embodiment the thin film 14 is formed only in the display area, in alternative configurations it may also be formed in the non-display area.

The display panel alignment keys 16 are individually formed in two opposite corners along a longitudinal side of the non-display area of the display panel 10. These display panel alignment keys 16 will be used in determining an alignment position of the display panel 10. The display panel alignment keys 16 are formed by patterning a thin film including at least one of a metal film, a metal oxidation film, and an inorganic film on the substrate 12. The display panel alignment keys 16 may be patterned by an imprint lithography process according to the present exemplary embodiment, as well as by a photolithography process.

Alternative exemplary embodiments include configurations where the display panel alignment keys 16 may be individually formed in two opposite corners of a lateral side of a non-display area of the display panel 10, or where they may be individually formed in two corners in a diagonal direction. Additionally, the number of the display panel alignment keys 16 may be one, three, or more as needed.

Figure 2C:
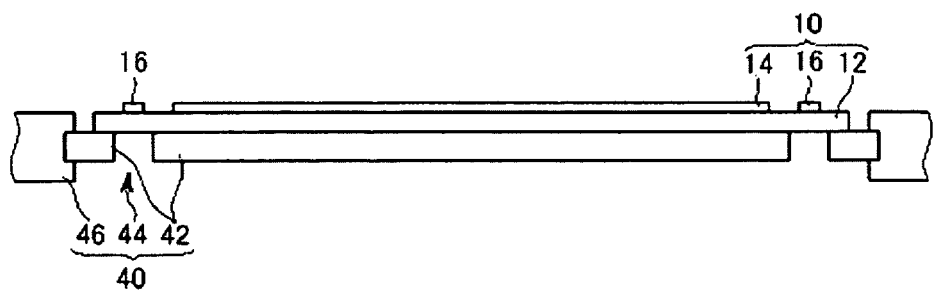
FIG. 2C to FIG. 2F are cross-sectional views of a display panel and an apparatus for manufacturing the display panel in intermediate steps of an exemplary embodiment of a method of manufacturing a display panel according to the present invention.

Thereafter, as shown in FIG. 2C, the display panel 10 is provided to and fixed in the arriving part 40.

Figure 2D:
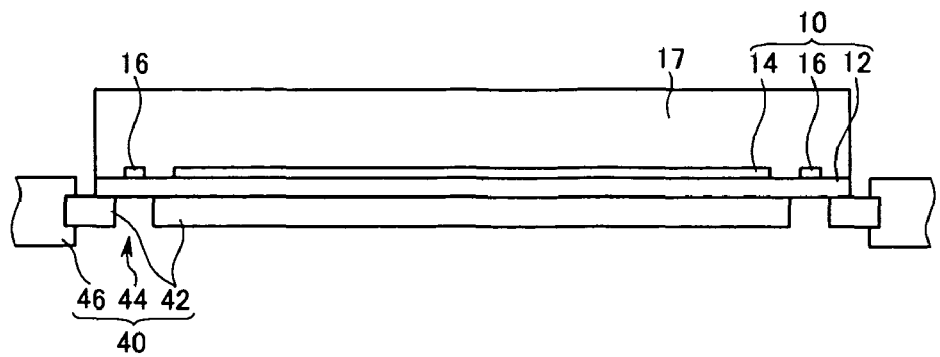

Then, as shown in FIG. 2D, an organic film 17 is coated on the display panel 10.

The organic film 17 is coated on the display panel 10 in a jell format or a liquid format having fluidity, by a spin coating method or a slit coating method. The organic film 17 protects the lower thin film 14, and acts as an insulating layer for insulating other films (not shown) which may be formed above or below the thin film 14. The organic film 17 may from a specific pattern and perform the same function as a photosensitive film in a photolithography process. When the thin film is used in such a manner the technique is called imprint lithography. The organic film 17 may be hardened by heat or ultraviolet rays because it includes at least one of a thermal hardener and an ultraviolet hardener.

In the present exemplary embodiment, the organic film 17 is applied to the display panel 10 after disposing the display panel 10 in the arriving part 40, but the present invention is not limited thereto. That is, the organic film 17 may be coated on the display panel 10 before disposing the display panel 10 on the arriving part 40.

Figure 2E:
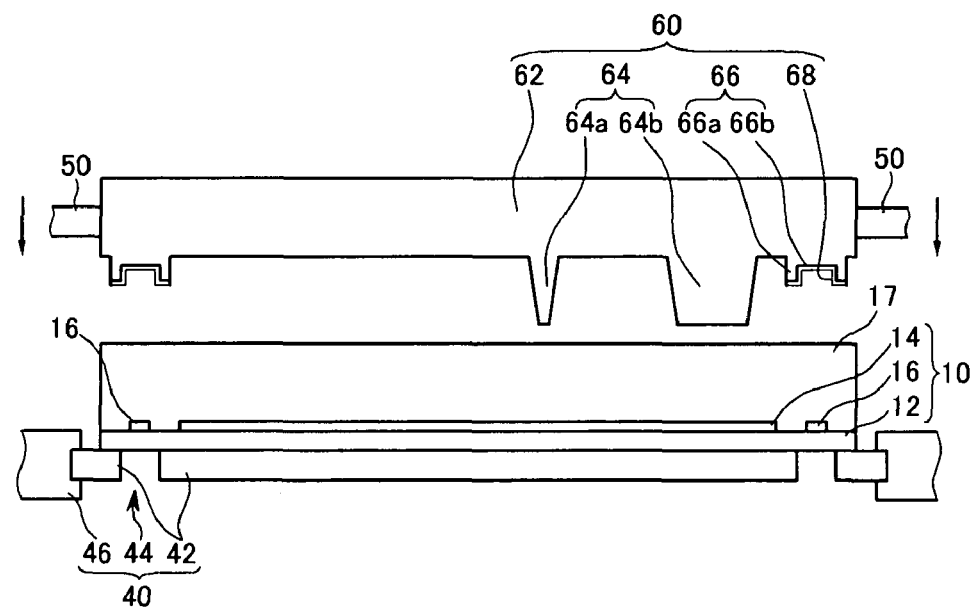
Figure 2F:
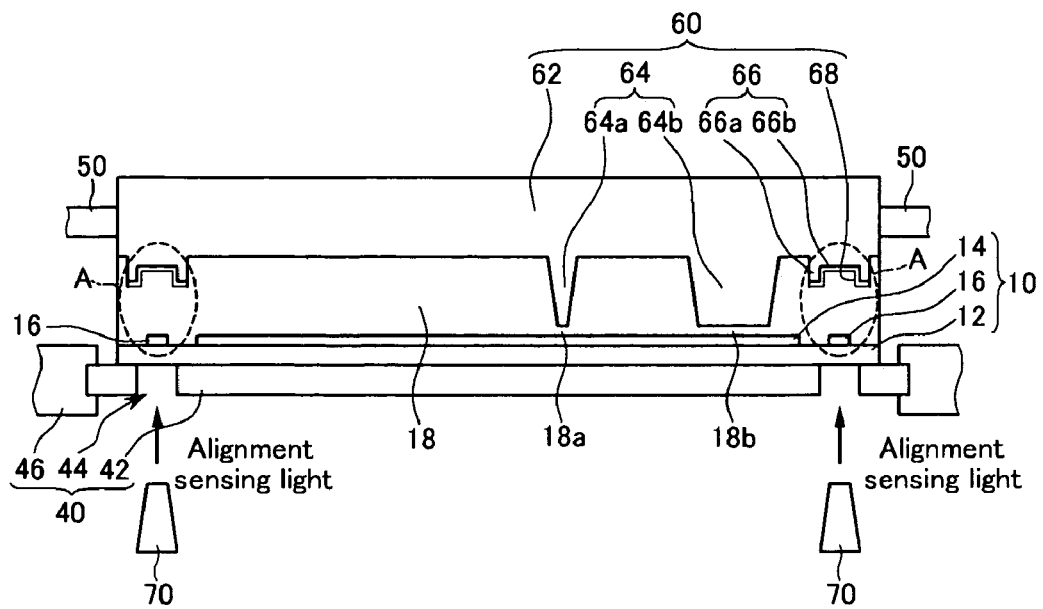
Figure 2G:
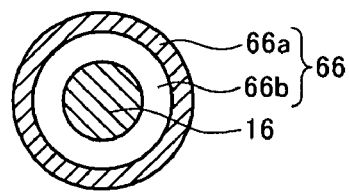
FIGS. 2G and 2H are views illustrating the position relationship of a first alignment key and a second alignment key in an 'A' region of FIG. 2F as seen from an alignment sensor below an arriving part.
Figure 2H:
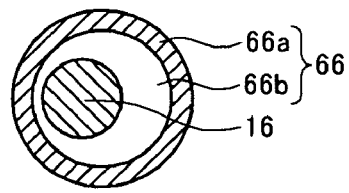
Figure 2I:
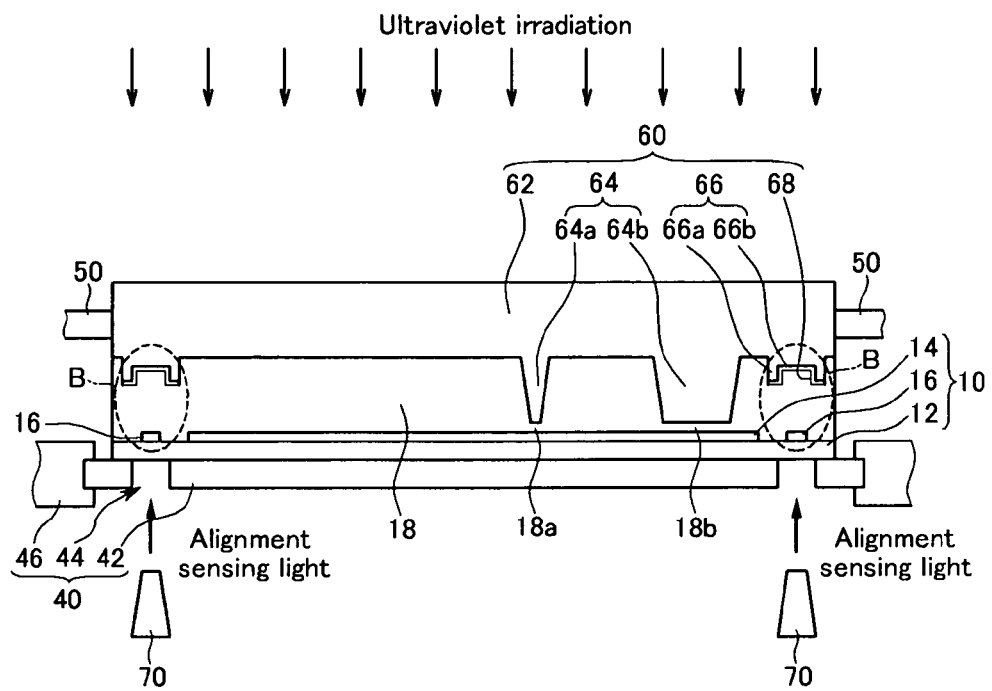
FIGS. 2I and 2J are cross-sectional views of a display panel and an apparatus for manufacturing the display panel in intermediate steps of an exemplary embodiment of a method of manufacturing a display panel according to the present invention.
Figure 2J:
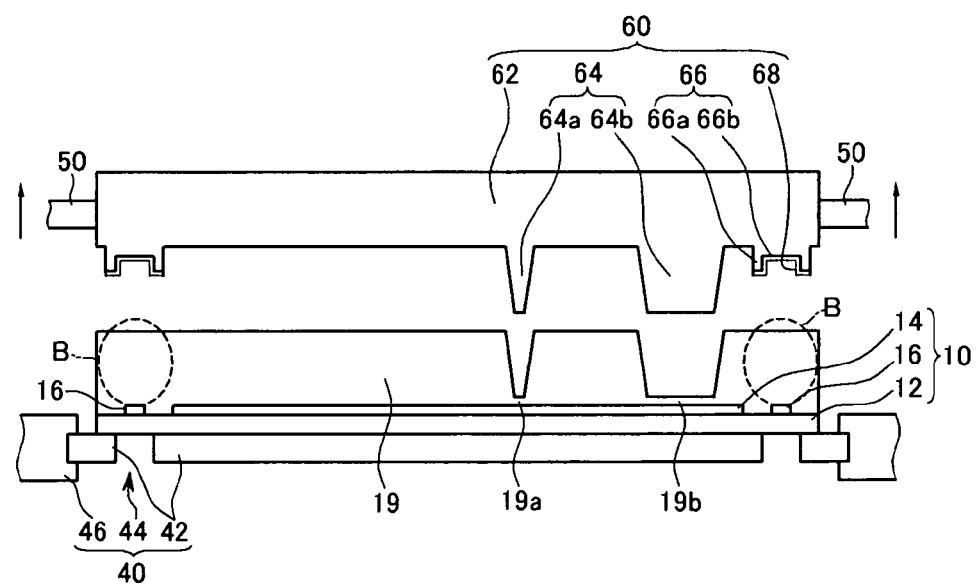
Figure 2K:
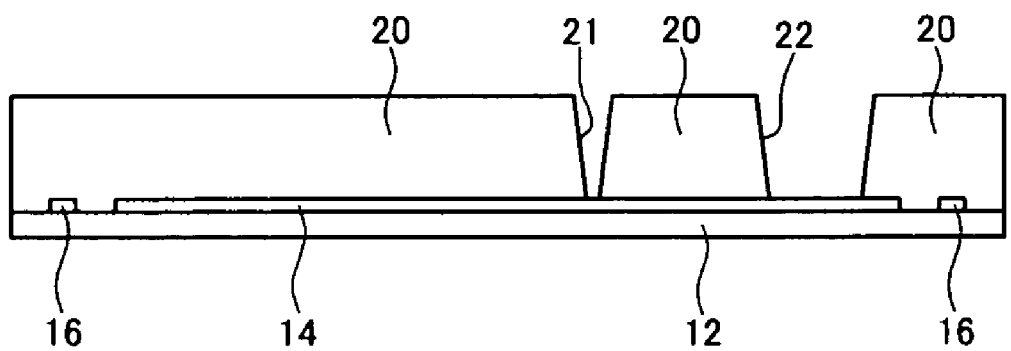
FIG. 2K is a cross-sectional view of a display panel in an intermediate step of an exemplary embodiment method of manufacturing a display panel according to the present invention.

Thereafter, as shown in FIGS. 2E and 2F, pressure is applied to the coated organic film 17 by the mold 60. The pressure is applied by positioning the mold 60 on the upper part of the organic film 17 and driving the mold driver 50 so as to form a specific pattern in the organic film 17.

The pattern forming part 64 is composed of different shapes of protrusions 64a and 64b. Accordingly, when pressure is applied, the organic film 17 becomes a compressed organic film 18 having compressed portions 18a and 18b corresponding to the respective shapes of the protrusions 64a and 64b of the mold 60. Each of the pattern forming parts 64a and 64b may be formed to have a different height. If the heights thereof are properly selected, an upper surface of each of the protrusions 64a and 64b may come in complete close contact with the thin film 14 when compression is performed.

Thereafter, as shown in FIG. 2F, the alignment sensor 70 is positioned in the lower part of the arriving part 40 and sensing light is irradiated toward the display panel alignment key 16 and the mold alignment key 66 on the 'A' region through the light transmitting part 44. The alignment sensor 70 then determines whether the display panel 10 and the mold 60 are aligned.

It is very important to align a mutual position between the display panel 10 and the mold 60 so as to form a specific pattern in a desired region of the display panel 10. The display panel 10 and the mold 60 can be accurately aligned by determining an alignment position and an alignment error between the display panel alignment key 16 and the mold alignment key 66 through irradiating the sensing light so as to confirm position alignment.

FIG. 2G shows an example where the display panel alignment key 16 and the mold alignment key 66 are accurately aligned, and shows that the display panel 10 and the mold 60 are aligned in a correct position and an alignment error between them is not generated. On the other hand, in FIG. 2H, because the display panel alignment key 16 and the mold alignment key 66 are not positioned in an alignment position, an alignment error is generated and thus shows that the display panel 10 and the mold 60 are not aligned in an accurate position.

Therefore, unlike a case where there is no alignment error as in FIG. 2G, when an alignment error is generated, such as is shown in FIG. 2H, a step of correcting the alignment error is performed. The correcting step is performed by moving at least one of the display panel 10 and the mold 60 relative to one another before hardening the compressed organic film 18. That is, the display panel 10 and the mold 60 are accurately aligned by relatively moving at least one of the arriving part 40 and the mold 60.

After the display panel 10 and the mold 60 are accurately aligned, the organic film 18 is hardened by irradiating ultraviolet light to the compressed organic film 18 after positioning an ultraviolet light irradiating part (not shown) at the upper part of the mold 60, as shown in FIG. 2I. When the compressed organic film 18 is hardened by irradiating ultraviolet rays, the mold 60 may be made of polydimethylsiloxane, which is a transparent material which passes ultraviolet light.

In an alternative exemplary embodiment the organic film 18 may be hardened by thermal hardening. When heat is used to harden the compressed organic film 18, the mold 60 may be made of an opaque material.

However, the non-transparent film 68 in the B part which is positioned at a lower part of the mold alignment key 66 blocks the ultraviolet light during ultraviolet hardening of the organic film 18. Therefore, hardening at that part is not performed. Accordingly, hardening is performed throughout the organic film 18 including the compressed portions 18a and 18b except in the organic film 18 corresponding to the B region located below the mold alignment key 66.

Thereafter, as shown in FIG. 2J, the mold 60 is removed from the hardened organic film 19.

When the mold 60 is removed it comes free easily because ultraviolet hardening is not performed in the B part and the part is in a liquid state or a jell state. Therefore, damage to the non-transparent film 68 can be reduced in the process of removing the mold 60. Accordingly, even when pressure is applied and the mold 60 is subsequently removed, proper performance of the non-transparent film 68 can be ensured. When the organic film 18 is hardened by ultraviolet rays, the non-transparent film 68 allows the mold 60 to be easily separated from the organic film by preventing the lower organic film 18 from hardening. Accordingly, a replacement time of the non-transparent film 68 is further extended, thereby reducing a manufacturing cost of the display panel. In the B part hardening is performed via a hardening process employing separate ultraviolet light or heat after the mold 60 is removed.

On the other hand, a heat hardening may be used in stead of the ultraviolet hardening. When the heat hardening is performed, the B part is also hardened as well as the other parts. Therefore, the non-transparent film 68 preferably include at least one of a metal film, a metal oxide film, and a strong inorganic film; thereby damage to the non-transparent film 68 can be reduced. Accordingly, a replacement time of the non-transparent film 68 is extended, thereby reducing a manufacturing cost of the display panel In a process of compressing the organic film 17 with the mold 60, when the pattern forming part 64 of the mold 60 comes in complete close contact to the thin film 14, the organic film 17 which coated the upper part of the thin film 14 corresponding to those pattern forming parts is pushed or squeezed away from the thin film 14, leaving little or no organic film 17 where the complete close contact was made. Accordingly, referring to FIG. 2K, the organic film 20 having predetermined patterns 21 and 22 are immediately formed through a hardening process. Therefore if the forming of the organic film 20 is the last step in the manufacture of a display panel, e.g., the organic film 20 is to form a passivation layer 180 or an organic insulator 187 as described below, then an etching process is not required.

However, as is shown in FIGS. 2F, 2I and 2J, when a predetermined part of the lower thin film 14 should be exposed and the organic film 19 remains in compressed portions 19a and 19b of the hardened organic film 19, a predetermined part of the thin film 14 may be exposed by etching the entire hardened organic film 19, as in FIG. 2K.

The organic film 20 may be used as a mask in a deposition process. The areas below the thin film 20 will not receive whatever material is to be deposited thereon, while the areas left exposed will receive the deposition. If the lower thin film 14 is etched by using the patterned organic film as an etching mask, the thin film 14 can be patterned by removing the areas of the thin film 14 which are not covered by the organic film 20. The organic film 20 may also be used as a constituent element of the display panel 10. When the residual organic film 20 is not to be used as a constituent element of the display panel 10 it may be removed by a separate etching process, thereafter the process of imprint lithography may begin again with the now etched thin film 14 or the newly deposited layer on top of the thin film 14 becoming the new thin film 14.

In a manufacturing apparatus and a manufacturing method of the display panel according to an exemplary embodiment of the present invention, in order to form a specific pattern in the thin film, the specific pattern can be easily formed through a pressing process employing the mold 60 without processes such as exposure and development which are used an existing photo lithography process. Such a process is referred to as an imprint lithography process, and manufacturing efficiency can be improved by eliminating processes such as exposure and development that require much time and cost in a photolithography process.

Therefore, if a display panel is manufactured by using an imprint lithography process which uses a pressing mold 60 according to an exemplary embodiment of the present invention, a specific material can be patterned efficiently and accurately.

Now, a method of manufacturing a display panel according to another exemplary embodiment of the present invention will be described in detail with reference to FIGS. 3 to 13. The display panel according to this exemplary embodiment of the present invention is used in a transflective liquid crystal display.

First, an exemplary embodiment of a liquid crystal display including a display panel manufactured by a method of manufacturing a display panel according to the present invention will be described in detail with reference to FIGS. 3 to 5.

Figure 3:
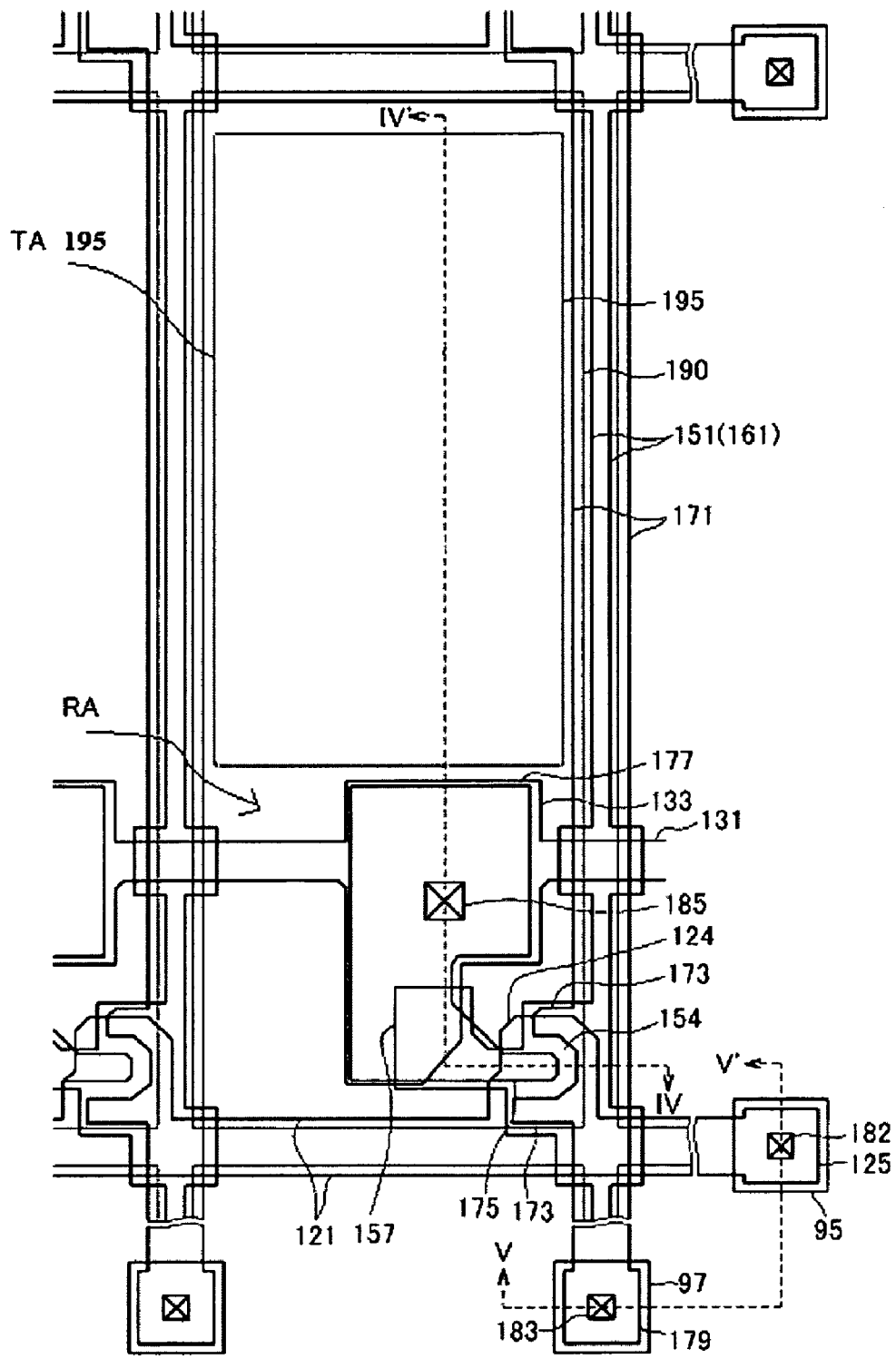
FIG. 3 is a top plan view layout of an exemplary embodiment of a liquid crystal display panel manufactured by an exemplary embodiment of a method of manufacturing the display panel according to the present invention.
Figure 4:
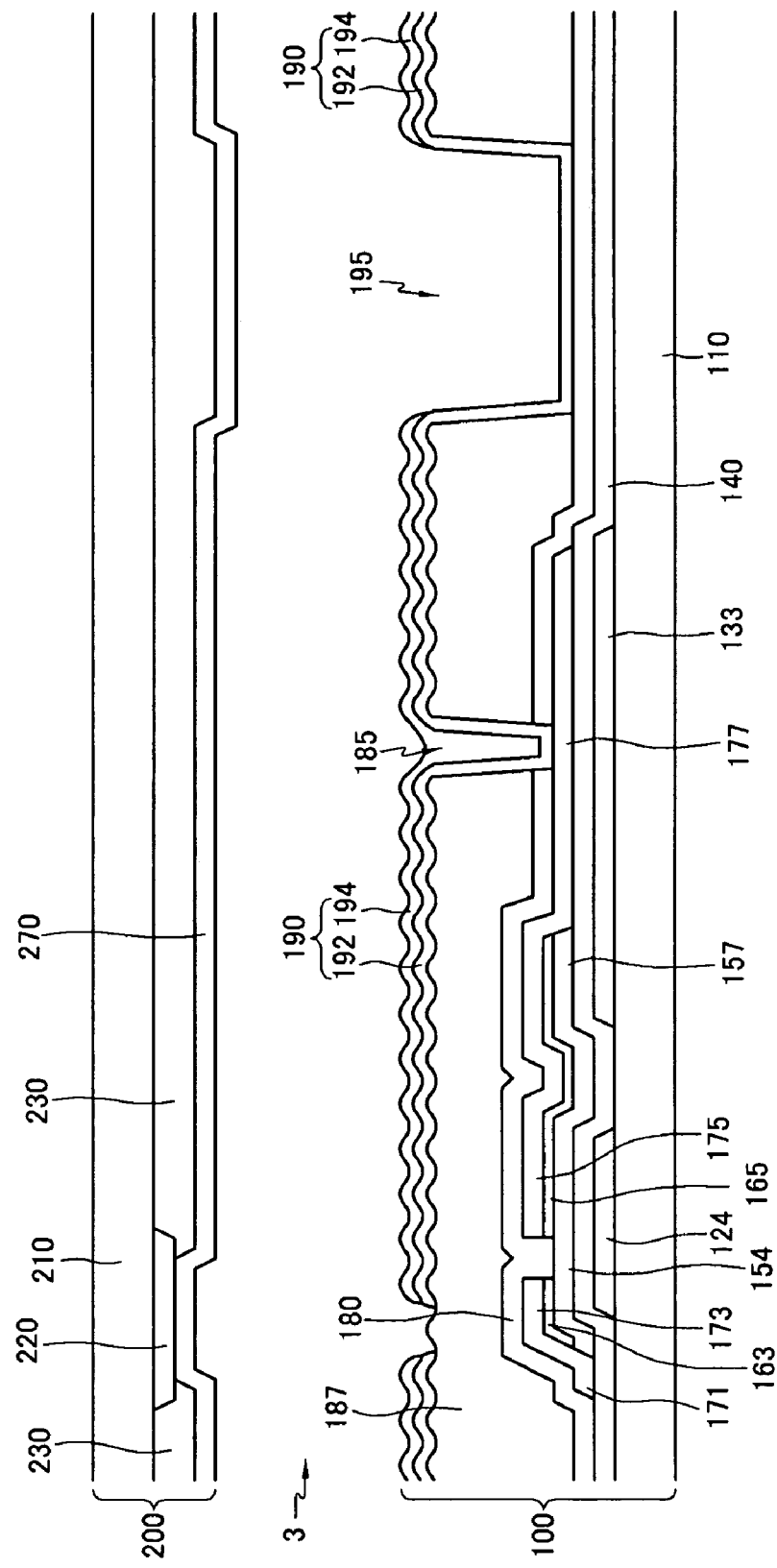
FIGS. 4 and 5 are cross-sectional views of the liquid crystal display taken along lines IV-IV' and V-V' of FIG. 3, respectively.
Figure 5:
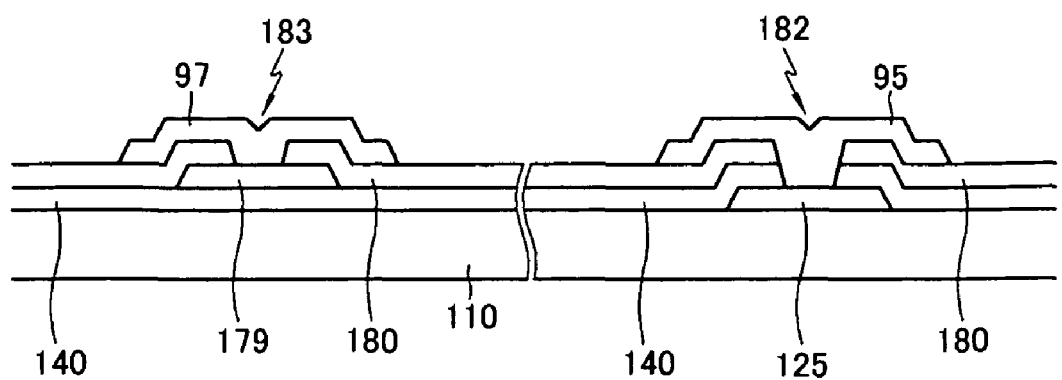

FIG. 3 is a top plan view layout of a liquid crystal display including an exemplary embodiment of a display panel manufactured by a method of manufacturing a display panel according to the present invention, and FIGS. 4 and 5 are cross-sectional views of the liquid crystal display taken along lines IV-IV' and V-V' of FIG. 3, respectively.

The exemplary embodiment of a liquid crystal display including a display panel manufactured according to the present invention includes a thin film transistor array panel 100, a common electrode panel 200 which is opposite thereto, and a liquid crystal layer 3 which is interposed therebetween and which includes liquid crystal molecules which are vertically or horizontally aligned with respect to the surfaces of two display panels 100 and 200.

The liquid crystal layer 3 may be aligned by a 90° twisted nematic ("TN") method, a vertical alignment ("VA") method, or an electrically controlled birefringence ("ECB") method.

First, as shown in FIGS. 3 to 5, in the thin film transistor array panel 100, a plurality of gate lines 121 and a plurality of storage electrode lines 131 are formed on the insulation substrate 110 which is made of a material such as transparent glass or other similar materials. Although not shown in the previous figures, the insulation substrate 110 may be a separate substrate formed on top of the substrate 12. Alternatively, the insulating substrate 110 may comprise all of, or simply a part of, the substrate 12.

The gate lines 121 mainly extend in a horizontal direction, are separated from each other, and transfer a gate signal. Each gate line 121 has a plurality of protrusions comprising gate electrodes 124, and an extension 125 at one end of the gate line 121 has a wide area for connecting to an external circuit (not shown).

The storage electrode lines 131 mainly extend in a horizontal direction, and include a plurality of protrusions comprising storage electrodes 133. A predetermined voltage such as a common voltage which is applied to a common electrode 270 of the common electrode panel 200 is applied to the storage electrode lines 131.

It is preferable that the gate lines 121 and the storage electrode lines 131 are made of aluminum metals such as aluminum (Al) or an aluminum alloy, silver metals such as silver (Ag) or a silver alloy, copper metals such as copper (Cu) or a copper alloy, molybdenum metals such as molybdenum (Mo) or a molybdenum alloy, chromium (Cr), titanium (Ti), thallium (Ta), or other substances with similar characteristics.

The gate lines 121 and the storage electrode lines 131 may include two layers, e.g., a lower layer (not shown) and an upper layer (not shown) which have different physical properties. In such a configuration the upper layer may be made of metals having low resistivity, e.g., aluminum metals such as aluminum (Al) or an aluminum alloy, in order to reduce a signal delay or a voltage drop of the gate lines 121 and the storage electrode lines 131. The lower layer of such a configuration is made of materials such as molybdenum (Mo), a molybdenum alloy, chromium (Cr), or other similar substances, having excellent contact characteristics with other materials, specifically indium tin oxide ("ITO") and indium zinc oxide ("IZO"). A combination of the lower layer and the upper layer may include, for example, chromium and an aluminum-neodymium (Nd) alloy.

Alternative exemplary embodiment include configurations where the gate lines 121 and the storage electrode lines 131 may have a single layer structure or include three layers or more.

Furthermore, side surfaces of the gate lines 121 and the storage electrode lines 131 are inclined relative to a surface of the substrate 110, and may have an inclination angle of about 20° to about 80°.

A gate insulating layer 140 which is made of silicon nitride ("SiNx"), for example, is formed on the gate lines 121 and the storage electrode lines 131.

A plurality of semiconductor stripes 151 which are made of hydrogenated amorphous silicon ("a-Si"), polycrystalline silicon, or so on are formed in an upper part of the gate insulating layer 140. The semiconductor stripes 151 mainly extend in a vertical direction, a plurality of protrusions 154 extend toward the gate electrodes 124 therefrom, and a plurality of extensions 157 extend therefrom. Furthermore, because the semiconductor stripes 151 have a wide width around an intersection at which they meet the gate lines 121 and the storage electrode lines 131, they essentially increase the surface area covered by the gate lines 121 and the storage electrode lines 131.

At the upper part of the semiconductor stripes 151, a plurality of ohmic contact stripes and islands 161 and 165 are formed. The ohmic contact stripes 161 and ohmic contact islands 165 are made of a material such as n+ hydrogenated amorphous silicon in which silicide or an n-type impurity is doped with a high concentration. The ohmic contact stripes 161 have a plurality of protrusions 163, and the protrusions 163 and the ohmic contact islands 165 are formed in pairs and positioned on the protrusions 154 of the semiconductor stripes 151.

Side surfaces of the semiconductor stripes 151 and the ohmic contacts 161 and 165 are also inclined to the surface of the substrate 110, and an inclination angle thereof is about 30° to about 80°.

A plurality of data lines 171 and a plurality of drain electrodes 175, which are separated therefrom, are formed on the ohmic contacts 161 and 165 and the gate insulating layer 140.

The data lines 171 mainly extend in a vertical direction to intersect the gate lines 121 and the storage electrode lines 131. The data lines 171 transfer a data voltage. Each data line 171 includes an extension 179 of which one end has a wide area so as to connect to other layers or an outside apparatus (not shown).

Each drain electrode 175 includes an extension 177 which overlaps one storage electrode 133. The data lines 171 include a plurality of protrusions along their length, and the length portion including the protrusions constitutes a source electrode 173. The source electrode 173 surrounds part of one end part of a drain electrode 175. A gate electrode 124, a source electrode 173, a drain electrode 175 and a protrusion 154 of a semiconductor stripe 151 constitute a thin film transistor ("TFT"), and a channel of the thin film transistor is formed in the protrusion 154 between the source electrode 173 and the drain electrode 175.

It is preferable that the data lines 171 and the drain electrodes 175 are made of refractory metals such as tantalum, titanium, chromium and molybdenum. The data lines 171 and the drain electrodes 175 may have a multilayer structure consisting of a lower layer (not shown) which is made of molybdenum (Mo), a molybdenum alloy, or chromium (Cr), and an upper layer (not shown) which is made of an aluminum metal. The upper layer is positioned on the lower layer.

Side surfaces of the data lines 171 and the drain electrodes 175 are inclined relative to the layer on which they are formed, and an inclination angle thereof is about 30° to about 80°, similar to the gate lines 121 and the storage electrode lines 131.

The ohmic contact stripe 161, the protrusions on the semiconductor stripe 163 and the ohmic contact island 165 are layered between the lower semiconductors 151 and the upper data lines 171 and drain electrodes 175, and perform a function of lowering contact resistance therebetween. Each semiconductor stripe 151 has an exposed portion (e.g., a portion between the source electrode 173 and the drain electrode 175) which is exposed without being covered by the data line 171, the drain electrode 175, or the ohmic contacts 161, 163 and 165.

A passivation layer 180 which is made of silicon nitride or silicon oxide, which are inorganic materials, is formed on an exposed portion of the semiconductor stripes 151, the data lines 171, and the drain electrodes 175. An organic insulator 187, which is made of an organic material having excellent planarization characteristics and photosensitivity, is formed above the passivation layer 180. A surface of the organic insulator 187 has a protrusion and depression pattern, e.g., a wavy pattern, and reflection efficiency of a reflecting electrode 194 (to be described below) to be disposed thereon is maximized thereby. At the extensions 125 and 179 of the gate line 121 and date line 171, respectively, the organic insulator 187 is removed, and only the passivation layer 180 remains.

A contact hole 183 for exposing the extension 179 of the data line 171 and a contact hole 182 for exposing the extension 125 of the gate line 121 along with the gate insulating layer 140 is formed in the passivation layer 180. Furthermore, a contact hole 185 for exposing the extension 177 of the drain electrode 175 is formed in the passivation layer 180 and the organic insulator 187. The contact holes 182, 183, and 185 may be formed in various shapes such as a polygonal or a circular shape, and a side wall thereof is inclined with an angle of about 30° to about 85° or may alternatively include a step shape.

A plurality of pixel electrodes 190 are formed on the organic insulator 187.

Each pixel electrode 190 includes a transparent electrode 192 and a reflecting electrode 194 which is formed on an upper part of the transparent electrode 192. The transparent electrode 192 is made of at least one of ITO or IZO, which are transparent conductive materials, and the reflecting electrode 194 is made of aluminum or an aluminum alloy, silver or a silver alloy, or other substances with similar characteristics, which are opaque and have reflectance. The pixel electrode 190 may further include a contact auxiliary layer (not shown) which is made of molybdenum or a molybdenum alloy, chromium, titanium, tantalum, or other substances with similar characteristics. The contact auxiliary layer secures contact characteristics of the transparent electrode 192 and the reflecting electrode 194, and performs a function of preventing the transparent electrode 192 from oxidizing the reflecting electrode 194.

Referring to FIG. 3, one pixel is largely divided into a transmitting region TA 195 and a reflecting region RA. The transmitting region TA 195 is a region in which the reflecting electrode 194 is removed, and the reflecting region RA is a region in which the reflecting electrode 194 is applied. The organic insulator 187 is removed in the transmitting region TA 195, and a cell gap, or the distance the liquid crystal layer crosses between the two substrates 100 and 200, in the transmitting region TA 195 is about two times as large as a cell gap in the reflecting region RA. Therefore, light in the reflection region RA and the transmitting region TA can be compensated for the effects of an optical path difference which is generated when light passes through the liquid crystal layer 3.

The pixel electrodes 190 are physically and electrically connected to the extensions 177 of the drain electrodes 175 through the contact holes 185 to receive a data voltage from the drain electrodes 175. A pixel electrode 190 to which the data voltage is applied and the common electrode 270 generate an electric field in the liquid crystal layer 3, thereby rearranging liquid crystal molecules between them.

Furthermore, because each pixel electrode 190 and the common electrode 270 constitute a capacitor (hereinafter, referred to as a "liquid crystal capacitor"), they maintain an applied voltage even after the thin film transistor is turned off. In order to enhance voltage storage ability, another capacitor which is connected in parallel to a liquid crystal capacitor is provided, and this capacitor is called a storage capacitor.

The storage capacitor is formed by overlapping the extension 177 of the drain electrode 175 and the storage electrode 133. Alternative exemplary embodiments include the configuration where the storage capacitor may be formed by overlapping the pixel electrode 190 and the gate line 121 which is adjacent thereto. In this alternative exemplary embodiment the storage electrode line 131 may be omitted.

The pixel electrode 190 is overlaps the gate line 121 and the data line 171 which is adjacent thereto to increase an aperture ratio, however it does not have to overlap the gate line 121 and the data line 171.

Alternative exemplary embodiments of the pixel electrode 190 include configurations where it comprises a transparent conductive polymer. Additionally, in the exemplary embodiment where the liquid crystal display is a reflective display the pixel electrode 190 may be made of an opaque reflective metal.

A plurality of contact assistants 95 and 97 are formed on the passivation layer 180 at the extension of the data line 179 and the extension of the gate line 125. The contact assistants 95 and 97 are connected to the extensions 125 of the gate lines 121 and the extensions 179 of the data lines 171 through the contact holes 182 and 183. The contact assistants 95 and 97 perform a function of supplementing adhesion between, and protecting, the extensions 125 and 179 of the gate lines 121 and the data lines 171 and the outside apparatus (not shown). However, they are not essential so their application is selective. Furthermore, they may be formed at the same time as a transparent electrode 192 or a reflecting electrode 194.

A light blocking member 220 which is referred to as a black matrix is formed on the substrate 210 which is made of an insulating material such as transparent glass and is formed in the common electrode panel 200 which is opposite to the thin film transistor array panel 100. The light blocking member 220 prevents light leakage between the pixel electrodes 190 of different pixels, and defines an opening region which is opposite to the pixel electrodes 190 which makes up the display region of an individual pixel.

A plurality of color filters 230 are formed on the substrate 210 and the light blocking member 220. Each color filter 230 can display one of three primary colors such as red, green, and blue. The color filters 230 are disposed over the transmitting region TA 195 and the reflecting region RA. Each of the plurality of color filters 230 are positioned between two neighboring data lines 171, and may be arranged in a vertical direction, and connected to each other, thereby forming one stripe. Alternative exemplary embodiments include configurations where the color filters 230 are arranged in diagonal or triangular patterns.

Each color filter 230 can compensate for a difference in color tone according to a difference of the number of times that light in a reflection region RA and a transmitting region TA passes the color filter 230. Color tone refers to the shading of a particular color. In the exemplary embodiment of a transflective display, light may pass through the color filter 230 above a reflecting region two or more times, once on the way in from the outside and again on the way out to the outside, and yet light may pass through the color filter 230 above a transmitting region TA 195 only once. To compensate for this difference in the number of times light passes through the color filter 230 the thickness in the transmitting region TA is formed to be greater than a thickness in the reflection region RA. Alternatively, the difference of color tone may be compensated by equally maintaining a thickness of the color filter 230 and forming a hole in the color filter 230 of the reflection region RA.

The common electrode 270, which is made of a transparent conductive material such as ITO or IZO, or other substance with similar characteristics, is formed on the light blocking member 220 and the color filter 230.

Now, a method of manufacturing the thin film transistor array panel of a liquid crystal display shown in FIG. 3 according to another exemplary embodiment of the present invention will be described in detail with reference to FIGS. 6 to 13.

Figure 6:
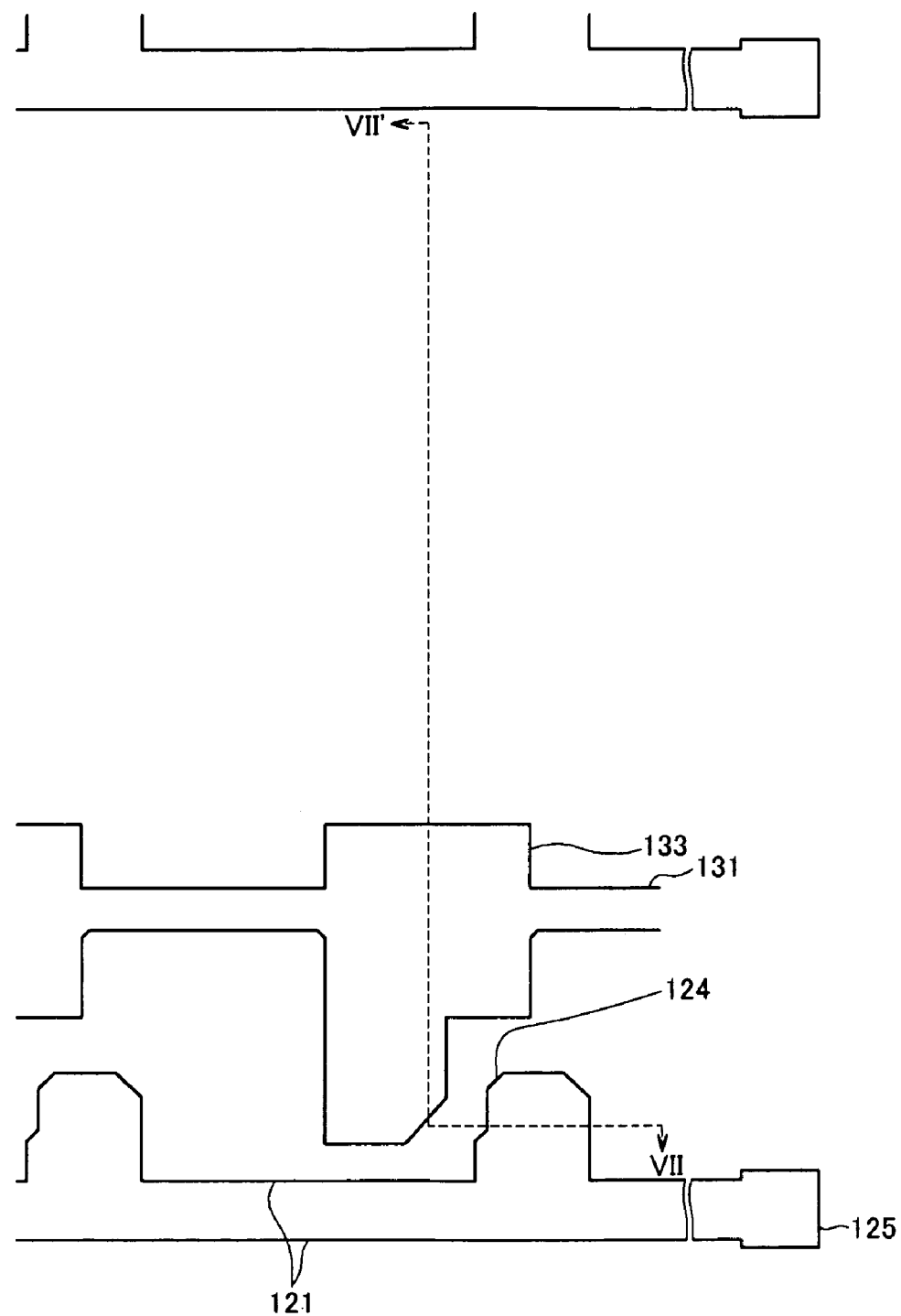
FIGS. 6, 8, 10, and 12 are top plan view layouts of the exemplary embodiment of a liquid crystal display panel shown in FIG. 3 each corresponding to an intermediate step of an exemplary embodiment of a method of manufacturing a display panel according to the present invention.
Figure 7:
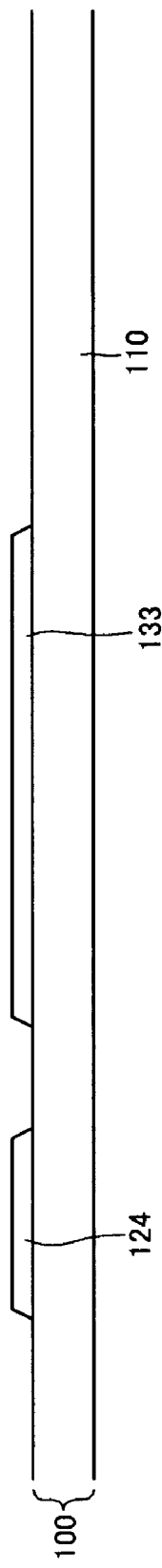
FIGS. 7, 9, 11, and 13 are cross-sectional views of the exemplary embodiment of a display panel taken along lines VII-VII', IX-IX', XI-XI', and XIII-XIII' of FIGS. 6, 8, 10, and 12, respectively.

First, as shown in FIGS. 6 and 7, a conductive layer, which is made of aluminum metals such as aluminum (Al) or an aluminum alloy, silver metals such as silver (Ag) or a silver alloy, copper metals such as copper (Cu) or a copper alloy, molybdenum metals such as molybdenum (Mo) or a molybdenum alloy, chromium (Cr), titanium (Ti), thallium (Ta), or other substances with similar characteristics, is formed on the insulation substrate 110 by a method such as sputtering.

Thereafter, an organic film for patterning is coated on the conductive layer using an imprint lithography process, which is an exemplary embodiment of a method of manufacturing a display panel according to the present invention as described above, and the organic film is patterned through a pressing process, an alignment process, a hardening process, and an etching process which uses the above-described mold. Thereafter, a plurality of storage electrode lines 131 including a plurality of storage electrodes 133 and a plurality of gate lines 121 including a plurality of gate electrodes 124 and extensions 125 are formed by etching the conductive layer using a patterned organic film as an etching mask. The patterned organic film which is used in the imprint lithography process performs the same function as a photosensitive film in a photolithography process, and is removed after forming the gate lines 121 and the storage electrode lines 131.

Figure 8:
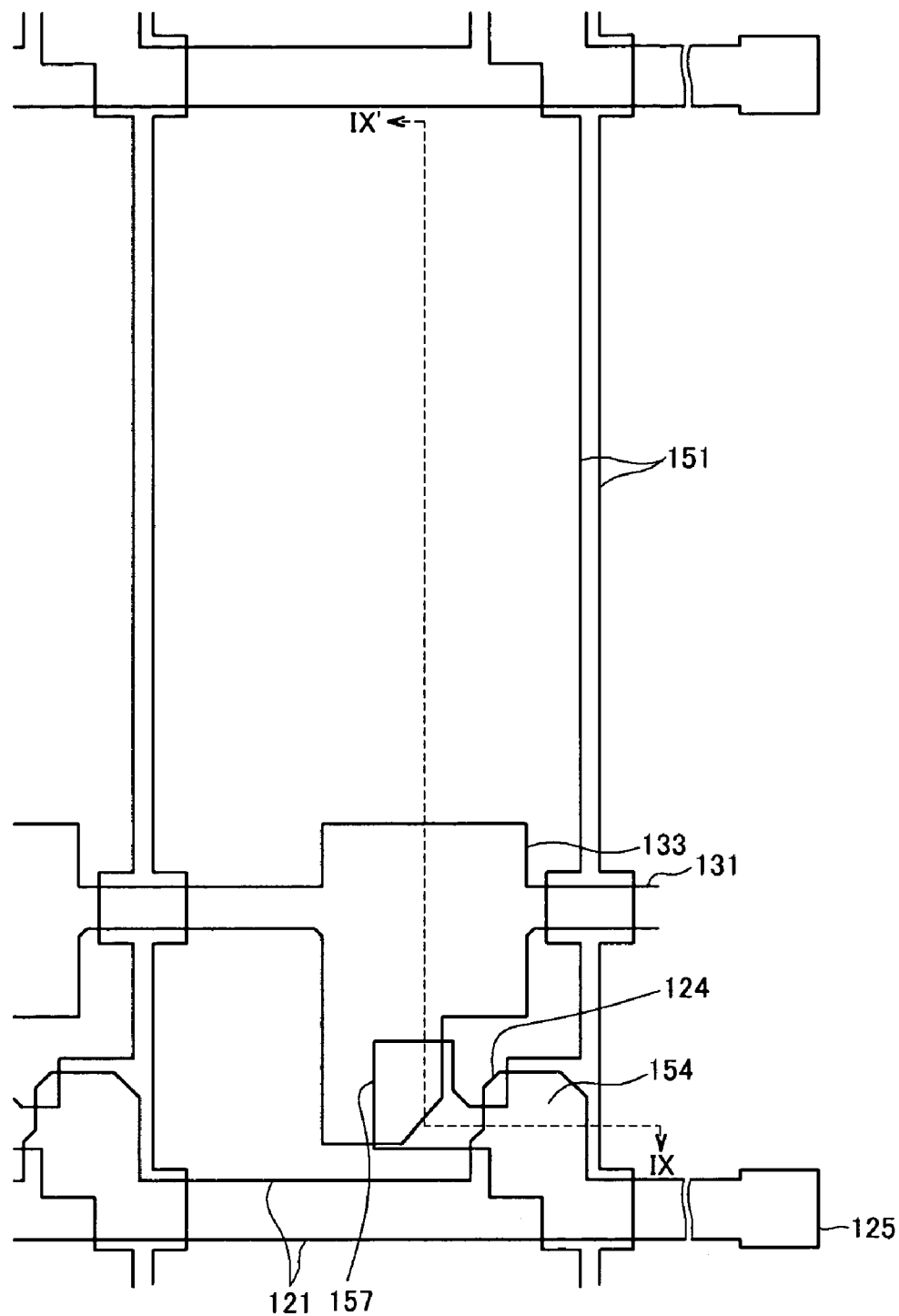
Figure 9:
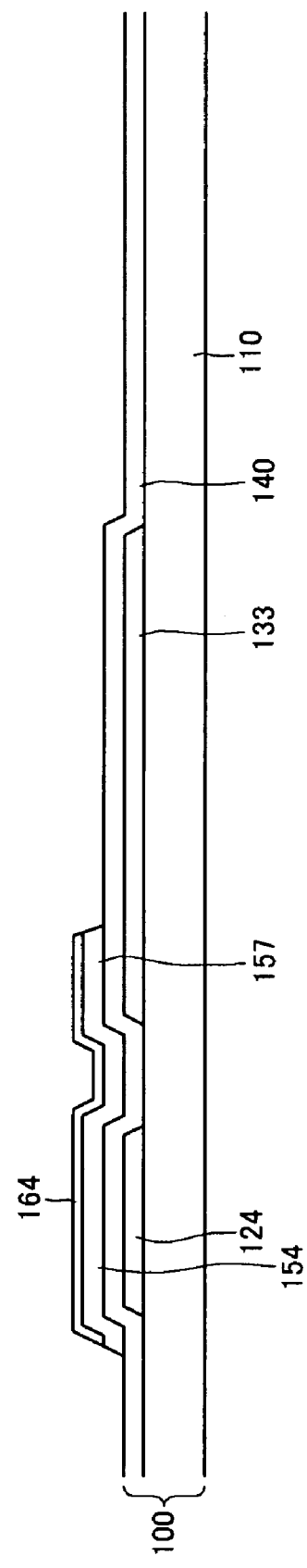

Next, as shown in FIGS. 8 and 9, the gate insulating layer 140 and a hydrogenated amorphous silicon film, which is an amorphous silicon film that is doped with an N+ impurity, are sequentially stacked to cover the gate lines 121 and the storage electrode lines 131. The gate insulating layer 140 and the hydrogenated amorphous silicon film may be formed through a low temperature chemical vapor deposition ("LPCVD") method and a plasma enhanced chemical vapor deposition ("PECVD") method. A plurality of semiconductors 151 and a plurality of ohmic contact patterns 164 including a plurality of protrusions 154 and a plurality of extensions 157 are made of the hydrogenated amorphous silicon film using the imprint lithography process according to an exemplary embodiment of the present invention. The gate insulating layer 140 is made of silicon nitride, or other substances with similar characteristics. The patterned organic film which is used in the imprint lithography process performs the same function as a photosensitive film in a photolithography process.

Figure 10:
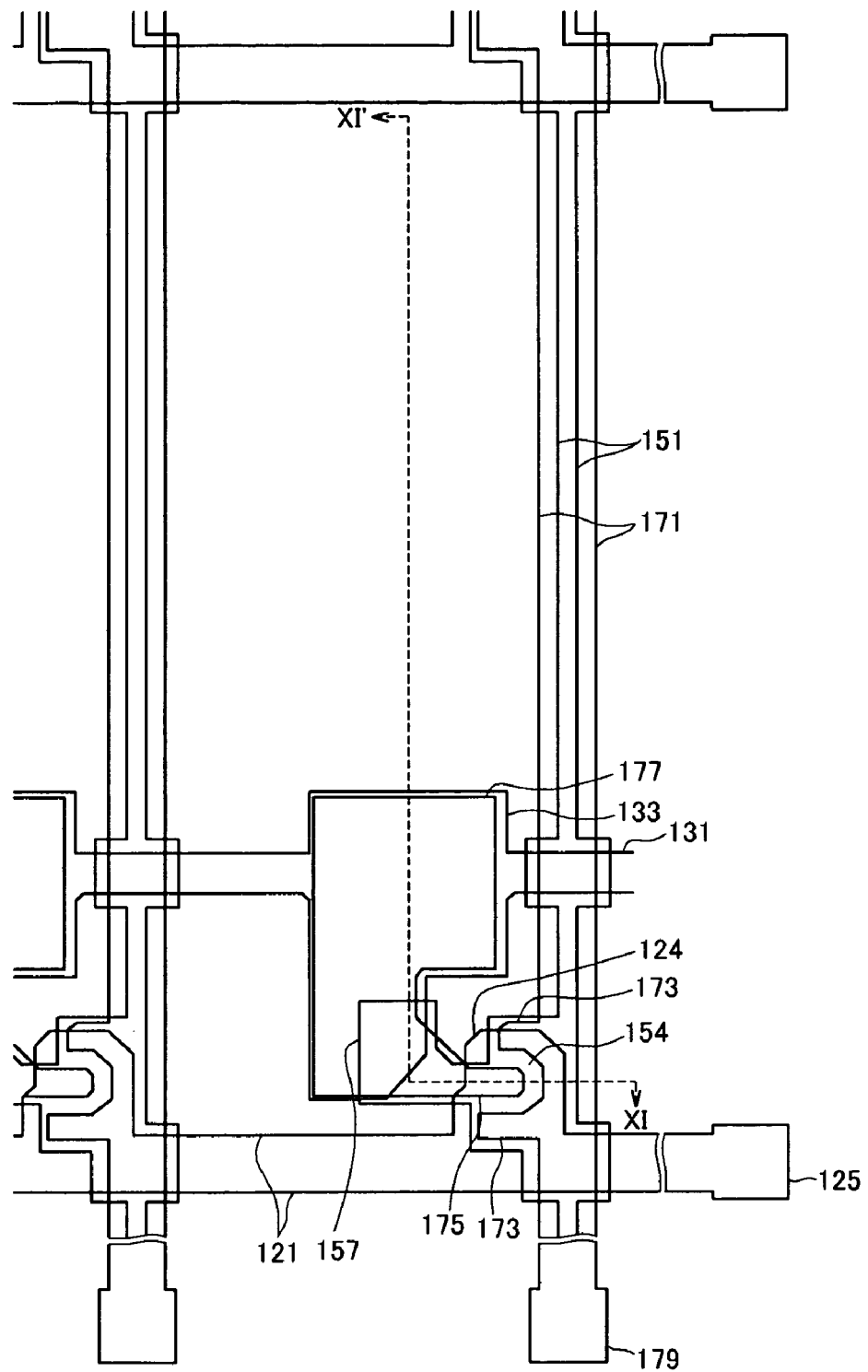
Figure 11:
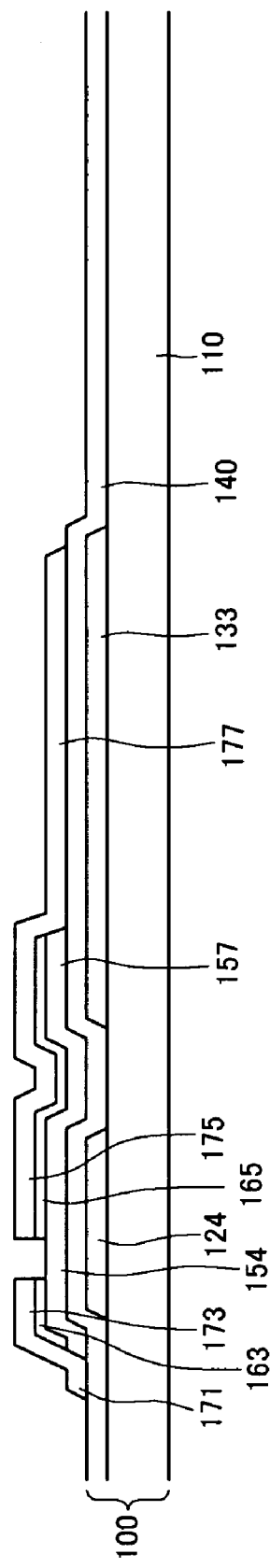

Next, as shown in FIGS. 10 and 11, the conductive layer, which is made of refractory metals such as tantalum, titanium, chromium, and molybdenum metals, is stacked by sputtering, or other suitable methods.

Thereafter, a plurality of drain electrodes 175, a plurality of extensions 177, and data lines 171 including a plurality of source electrodes 173 are formed by etching the conductive layer through the imprint lithography process according to an exemplary embodiment of the present invention. The patterned organic film which is used in an imprint lithography process performs the same function as a photosensitive film in a photolithography process.

The ohmic contact pattern 164 is divided into two ohmic contacts 163 and 165, and a part of the semiconductor 154 between the two is exposed by removing a part of the ohmic contact pattern 164 which is not covered by the data line 171 and the drain electrode 175. According to one exemplary embodiment, oxygen plasma is generated thereafter to stabilize a surface of the exposed semiconductor 154.

Figure 12:
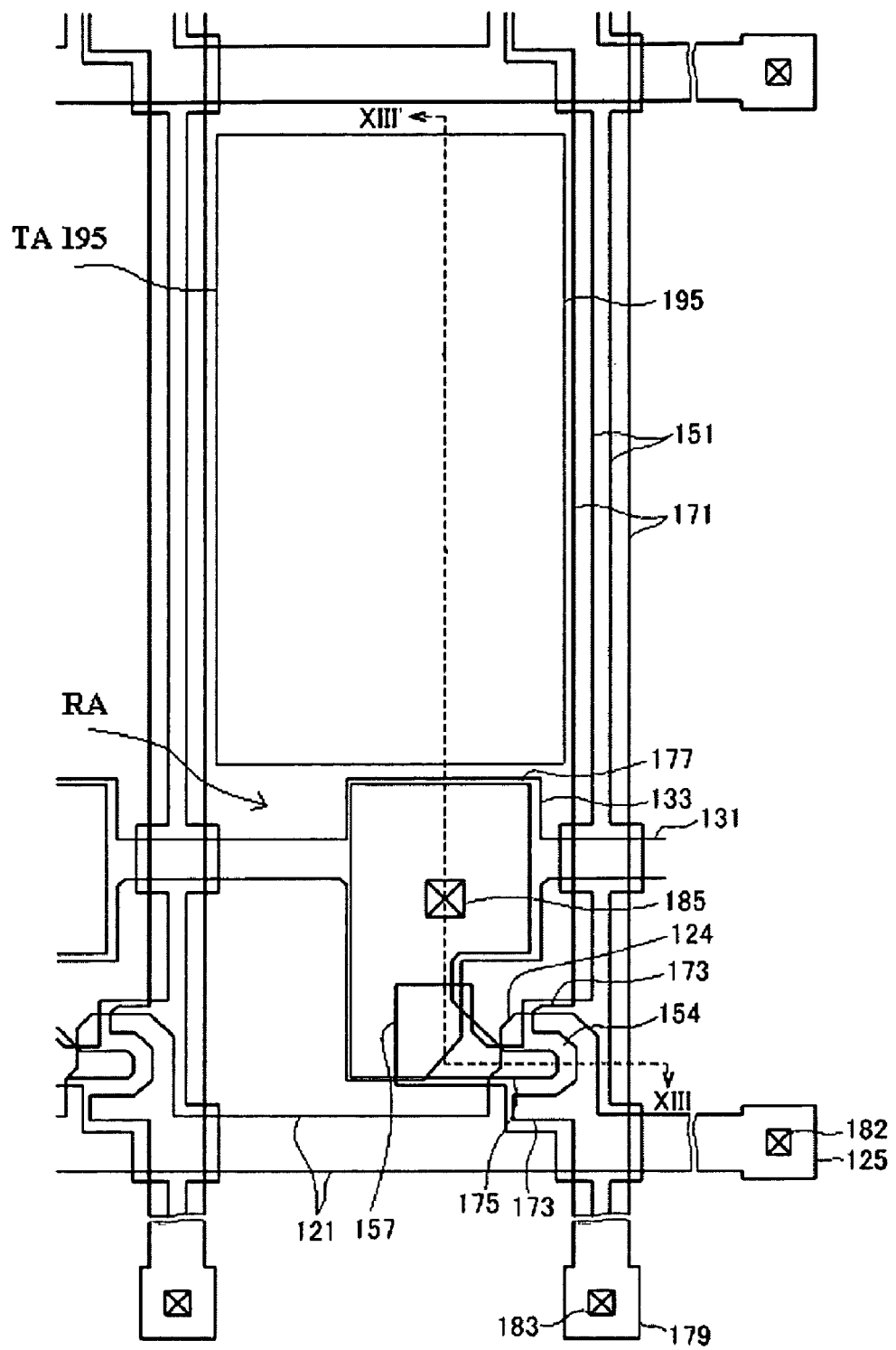
Figure 13:
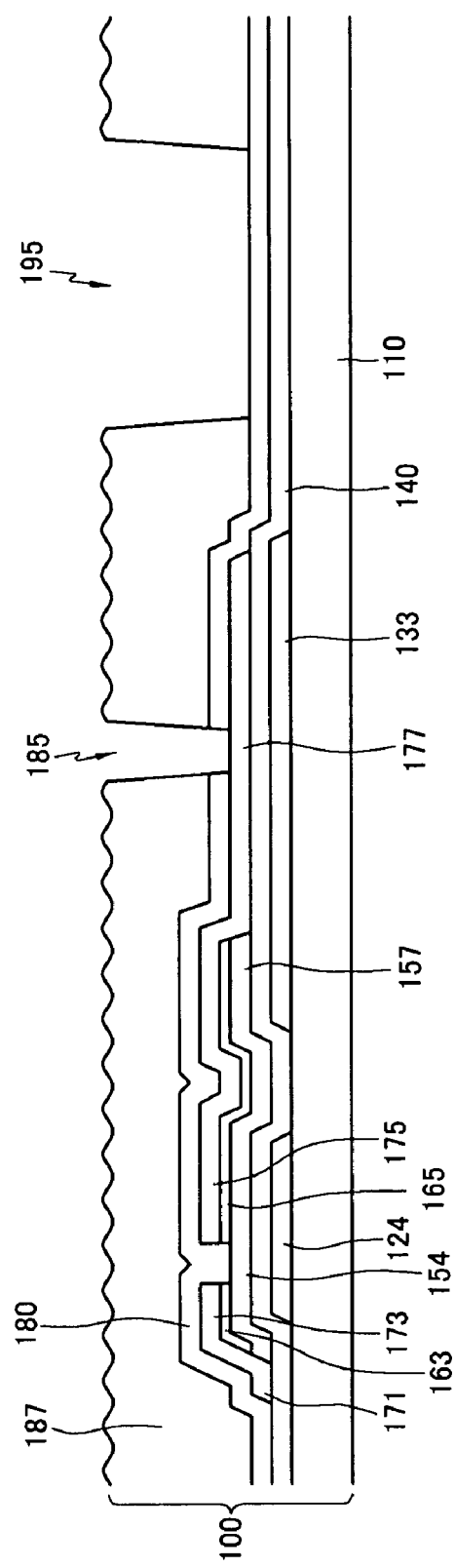

Next, as shown in FIGS. 12 and 13, the passivation layer 180 which is made of silicon nitride, or other substances with similar characteristics, is formed by a chemical vapor deposition ("CVD") method and is coated with an organic insulator formation material which is made of an organic material, and the organic insulator 187 is patterned through an imprint lithography process according to the an exemplary embodiment of the present invention. Since a pattern of protrusion and depression shapes may be formed in a main body of a mold (corresponding to reference numeral 60 in FIG. 2F) which is used in a pressing process, protrusion and depression shapes of the pattern are formed in the patterned organic insulator 187. The protrusion and depression shapes may be used to increase the reflection efficiency of the reflecting electrode 194 described below.

Furthermore, a plurality of contact holes 185 for exposing the passivation layer 180 at an upper part of the extension 177 are formed in the organic insulator 187. The passivation layer 180 is exposed by removing a part of the organic insulator 187 in the transmitting region TA 195. Referring back to FIG. 2K, the patterned organic film 20 which is used in an imprint lithography process at this step is not removed after patterning the passivation layer 180 with the organic insulator 187. This is unlike the other steps where the organic film was removed via an etching process.

Thereafter, a plurality of contact holes 185 are completed by patterning the lower passivation layer 180 through an etching process using the patterned organic insulator 187.

Next, a plurality of transparent electrodes 192 which are connected to the drain electrode 175 through the contact hole 185 is formed through an imprint lithography process according to an exemplary embodiment of the present invention. When the reflecting electrode 194, which is made of silver, aluminum, or other similar substances, is formed in an upper part of the transparent electrode 192 of the reflection region RA through the imprint lithography process, the thin film transistor array panel 100, which is manufactured by an exemplary embodiment of a manufacturing method according to the present invention, which is shown in FIG. 3, is completed. The patterned organic film 20, which is used in an imprint lithography process for forming the transparent electrode 192 and the reflecting electrode 194, performs the same function as a photosensitive film in a photolithography process.

In the description, a case of forming all thin films of the thin film transistor array panel 100 with an imprint lithography process is described, but in alternative exemplary embodiments only some of the thin films may be formed with an imprint lithography process and the others may be formed through a photolithography process or a picture process.

If an imprint lithography process is performed using a manufacturing apparatus and a manufacturing method of the display panel according to several exemplary embodiments of the present invention, a thin film itself or an etching mask pattern for etching a thin film can be easily formed without processes such as exposure and development which are included in the photolithography process.

In addition, since an alignment sensor for confirming the alignment of the display panel and the mold may be positioned in a lower part of the arriving part, a mold driver and an ultraviolet light irradiating part for ultraviolet hardening can be easily positioned above the upper part of the display panel. Therefore, an imprint lithography process can be easily performed even within a small space.

Furthermore, when a non-transparent film in a mold alignment key is made from a metal film, a metal oxidation film, and a strong inorganic film the non-transparent film is prevented from being easily damaged when the mold is separated from the organic film.

When the organic film is hardened with ultraviolet rays, the non-transparent film prevents the lower organic film 18 from hardening, whereby the mold can be easily separated from the organic film. Accordingly, a replacement time of the non-transparent film 68 is further extended, thereby further reducing a manufacturing cost of the display panel.

Therefore a predetermined thin film can be efficiently and accurately patterned according to a method of manufacturing a display panel through an imprint lithography process using an exemplary embodiment of a pressing mold of the present invention.

While this invention has been described in connection with what is presently considered to be practical exemplary embodiments, it is to be understood that the invention is not limited to the disclosed embodiments, but, on the contrary, is intended to cover various modifications and equivalent alignments included within the spirit and scope of the appended claims.

What is claimed is:

1. A method of manufacturing a display panel comprising:
  providing a display panel comprising a display area and a non-display area which is formed around the display area and which includes at least one first alignment key formed in the non-display area;
  disposing the display panel in an arriving part having a light transmitting part;
  coating an organic film on the display panel;
  pressurizing the organic film using a mold including at least one second alignment key and a pattern forming part, the at least one second alignment key being disposed outside of the pattern forming part;
  determining whether the display panel and the mold are erroneously aligned by confirming an aligned state of the first alignment key and the second alignment key through the light transmitting part after pressurizing the organic film using the mold;

hardening the organic film; and removing the mold from the hardened organic film.

2. The method of claim 1, further comprising etching the organic film after the removing the mold.

3. The method of claim 1, wherein the determining whether the display panel and the mold are erroneously aligned includes irradiating an alignment sensing light through the light transmitting part; and determining a positional relationship between the first alignment key and the second alignment key by sensing a reflection of the alignment sensing light from either of the first and second alignment sensing keys.

4. The method of claim 1, further comprising a step between determining whether the display panel and the mold are erroneously aligned and hardening the organic film, the step comprising aligning the display panel and the mold by relatively moving at least one of the display panel and the mold.

5. The method of claim 1, wherein the organic film is a resin film.

6. The method of claim 1, wherein at least one of heat hardening and ultraviolet hardening is used in hardening the organic film.

7. The method of claim 6, further comprising additionally hardening the organic film which is positioned in a part corresponding to the second alignment key when ultraviolet hardening is used in the hardening the organic film.

* * * * *